United States Patent
Choi et al.

(10) Patent No.: US 11,363,733 B2
(45) Date of Patent: Jun. 14, 2022

(54) ELECTRONIC DEVICE INCLUDING WATERPROOF PRINTING STRUCTURE AND MANUFACTURING METHOD THEREFOR

(71) Applicant: Samsung Electronics Co., Ltd., Gyeonggi-do (KR)

(72) Inventors: Jongmun Choi, Gyeonggi-do (KR); Hyeonbeom Kim, Gyeonggi-do (KR); Hyunsuk Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 15 days.

(21) Appl. No.: 17/058,183

(22) PCT Filed: May 21, 2019

(86) PCT No.: PCT/KR2019/006060
§ 371 (c)(1),
(2) Date: Nov. 24, 2020

(87) PCT Pub. No.: WO2019/225944
PCT Pub. Date: Nov. 28, 2019

(65) Prior Publication Data
US 2021/0168958 A1    Jun. 3, 2021

(30) Foreign Application Priority Data

May 24, 2018    (KR) .................. 10-2018-0059014

(51) Int. Cl.
*H04B 1/38*      (2015.01)
*H05K 5/06*      (2006.01)
(Continued)

(52) U.S. Cl.
CPC .......... *H05K 5/069* (2013.01); *C09D 5/1656* (2013.01); *H04B 1/3833* (2013.01); *H04M 1/18* (2013.01); *H04B 2001/3894* (2013.01)

(58) Field of Classification Search
None
See application file for complete search history.

(56) References Cited

U.S. PATENT DOCUMENTS 8,718,724 B2 * 5/2014 Fuke ................... H04M 1/18
                                              455/575.3
9,386,716 B2 * 7/2016 Arao ................... H01H 9/04
(Continued)

FOREIGN PATENT DOCUMENTS

KR    10-1021841 B1    3/2011
KR    10-1460305 B1    11/2014
(Continued)

OTHER PUBLICATIONS

Notice of Patent Grant dated Apr. 21, 2022.

*Primary Examiner* — Xanthia C Cunningham
(74) *Attorney, Agent, or Firm* — Cha & Reiter, LLC

(57) ABSTRACT

An electronic device, according to various embodiments, may comprise: an outer housing comprising a front plate facing a first direction, a rear plate facing a direction opposite to the front plate, and a side member for surrounding a space between the front plate and the rear plate, wherein the side member protrudes toward the space and includes a protrusion having a first surface facing the first direction; an opaque layer disposed in the space so as to be parallel with the front plate and including a first portion located between the first surface and the front plate, wherein the first portion includes a second surface facing the first surface; an adhesiveness improvement layer formed on the second surface of the opaque layer and having a repetitive pattern; and a waterproof layer disposed between the adhesiveness improvement layer and the first surface and attached to the adhesiveness improvement layer and the first surface. Other various embodiments may be possible.

15 Claims, 17 Drawing Sheets

(51) Int. Cl.
    *C09D 5/16*     (2006.01)
    *H04B 1/3827*     (2015.01)
    *H04M 1/18*     (2006.01)

(56) References Cited

U.S. PATENT DOCUMENTS

| | | | |
|---|---|---|---|
| 9,844,157 B1 * | 12/2017 | Spencer | H05K 5/0221 |
| 10,575,414 B2 * | 2/2020 | Kim | H01L 27/323 |
| 2010/0298025 A1 | 11/2010 | Spence | |
| 2013/0242226 A1 * | 9/2013 | Jeong | G02F 1/133512 |
| | | | 445/24 |
| 2014/0063705 A1 * | 3/2014 | Song | H05K 5/0017 |
| | | | 361/679.01 |
| 2014/0066144 A1 | 3/2014 | Hong | |
| 2015/0282364 A1 | 10/2015 | Moon et al. | |
| 2017/0063421 A1 | 3/2017 | Moon et al. | |
| 2017/0253719 A1 | 9/2017 | Morozumi et al. | |
| 2017/0266919 A1 | 9/2017 | Seok | |
| 2018/0183912 A1 * | 6/2018 | Lim | H04M 1/236 |
| 2018/0275749 A1 | 9/2018 | Yoon et al. | |

FOREIGN PATENT DOCUMENTS

| | | |
|---|---|---|
| KR | 10-2015-0112208 A | 10/2015 |
| KR | 10-1663984 B1 | 10/2016 |
| KR | 10-2017-0025985 A | 3/2017 |
| KR | 10-2017-0068984 A | 6/2017 |
| KR | 10-2018-0032086 A | 3/2018 |
| WO | 2017/069324 A1 | 4/2017 |
| WO | 2017-069324 A1 | 4/2017 |

* cited by examiner

ELECTRONIC DEVICE INCLUDING WATERPROOF PRINTING STRUCTURE AND MANUFACTURING METHOD THEREFOR

CROSS-REFERENCE TO RELATED APPLICATION(S)

This application is a National Phase Entry of PCT International Application No. PCT/KR2019/006060, which was filed on May 21, 2019 and claims priority to Korean Patent Application No. 10-2018-0059014, which was filed on May 24, 2018 in the Korean Intellectual Property Office, the contents of which are incorporated herein by reference.

TECHNICAL FIELD

The disclosure relates to an electronic device including a waterproof printing structure, and a method for manufacturing the same.

BACKGROUND ART

Electronic devices may be applied to various fields related to human living. The electronic devices have various sizes according to their functions and the preferences of the users, and the external appearances as well as various functions and the slimness thereof may be an important design factor. For example, among electronic devices having substantially the same functions provided by different manufacturers, users actually prefer a device having more excellent and appealing designs.

DISCLOSURE OF INVENTION

Technical Problem

An electronic device may have a waterproof function via a waterproof layer interposed between a housing and a cover plate. The waterproof layer may be attached to a printing film attached to a cover plate or a printing structure formed on the rear surface of the cover plate, and a surface in contact with the waterproof layer of the printing structure may include an attachment layer including an additive such as an acrylic resin and silicon beads to improve an attachment force or a bonding force between the waterproof layer and the printing structure.

However, because the attachment layer increases production costs and an attachment force cannot be quantified, it is difficult to secure a lamination property for maintenance and repair even though the attachment force is improved, and when the attachment layer is applied to a cover plate including a curved surface, defects such as cracks or wrinkles may be caused as stress applied to the curved portion is concentrated. Further, a defect rate of the products may significantly increase due to an interface stress applied according to discrepancies of the properties, such as the densities and the thermal expansion coefficients of an opaque layer (e.g., a shielding/printing layer) in contact with the attachment layer, and the attachment layer.

Various embodiments of the disclosure may provide an electronic device including a waterproof printing structure, and a method for manufacturing the same.

Various embodiments of the disclosure also provide an electronic device including a waterproof printing structure for reducing production costs, and a method for manufacturing the same.

Various embodiments of the disclosure may provide an electronic device including a waterproof printing structure that may contribute to improvement of a delamination property for an excellent attachment force and maintenance and repair by quantifying and setting an attachment force or a bonding force with a waterproof layer, and a method for manufacturing the same.

Solution to Problem

In accordance with an aspect of the disclosure, an electronic device may include: an outer housing including a front plate facing a first direction, a rear plate facing an opposite direction to the front plate, and a side member surrounding a space between the front plate and the rear plate, wherein the side member includes a protrusion protruding toward the space and including a first surface facing the first direction; an opaque layer disposed in the space to be parallel to the front plate and including a first portion located between the first surface and the front plate, wherein the first portion includes a second surface facing the first surface; an adhesive improvement layer formed on the second surface of the opaque layer and having repeated patterns; and a waterproof layer disposed between the adhesive improvement layer and the first surface and attached to the adhesive improvement layer and the first surface.

In accordance with another aspect of the disclosure, an electronic device may include: an outer housing including a front plate facing a first direction, a rear plate facing an opposite direction to the front plate, and a side member surrounding a space between the front plate and the rear plate, wherein the side member includes a protrusion protruding toward the space and including a first surface facing the first direction; an opaque layer disposed in the space to be parallel to the front plate and including a first portion located between the first surface and the front plate, wherein the first portion includes a second surface facing the first surface and including repeated patterns; and a waterproof layer disposed between the second surface and the first surface and attached to the second surface and the first surface.

In accordance with another aspect of the disclosure, a method for manufacturing an electronic device may include: attaching a substrate film to at least a partial area of a front plate; forming an opaque layer on the substrate film; forming an adhesive improvement layer having repeated patterns, on the opaque layer; attaching a waterproof layer to the adhesive improvement layer; and attaching the front plate to an outer housing via the waterproof layer.

Advantageous Effects of Invention

An electronic device according to various embodiments of the disclosure includes an attachment improvement layer having a plurality of patterns on a bonding surface to improve an attachment force with a waterproof layer, so that an attachment force or a bonding force can be set and quantified according to the configurations of the plurality of patterns and production costs can be reduced.

BRIEF DESCRIPTION OF DRAWINGS

With regard to description of drawings, the same or similar components may be marked by the same or similar reference numerals.

BEST MODE FOR CARRYING OUT THE INVENTION

Figure 1:
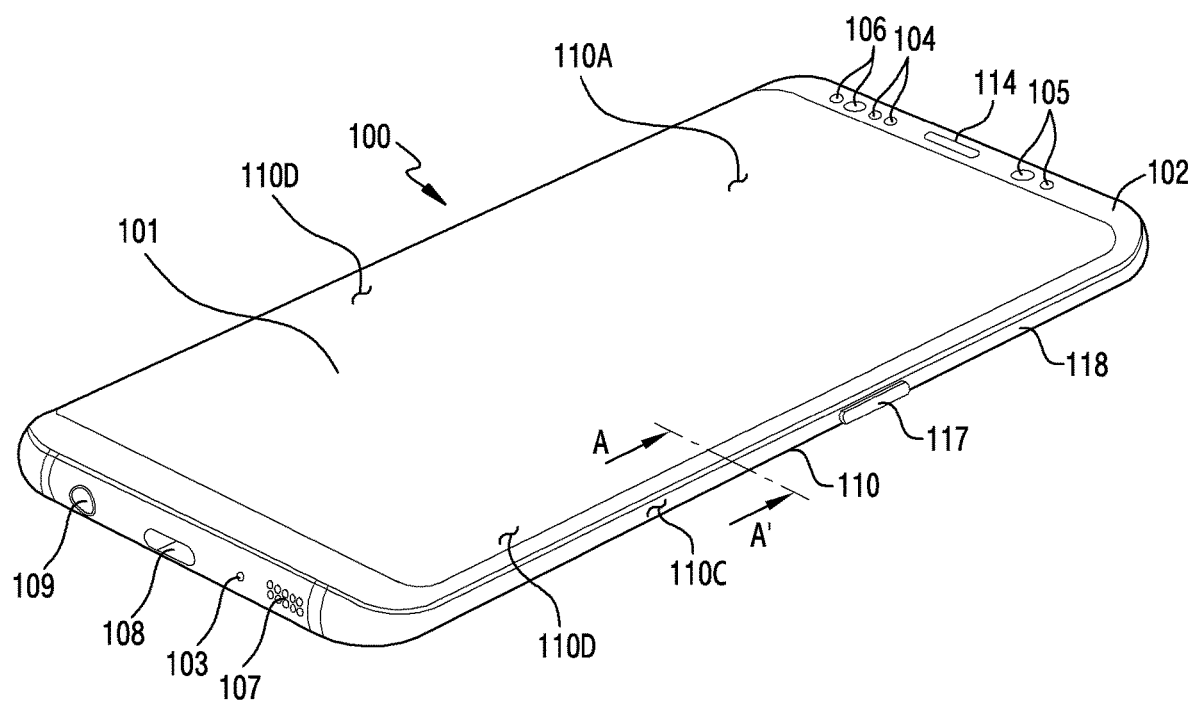
FIG. 1 is a front perspective view of a mobile electronic device according to various embodiment of the disclosure.
Figure 2:
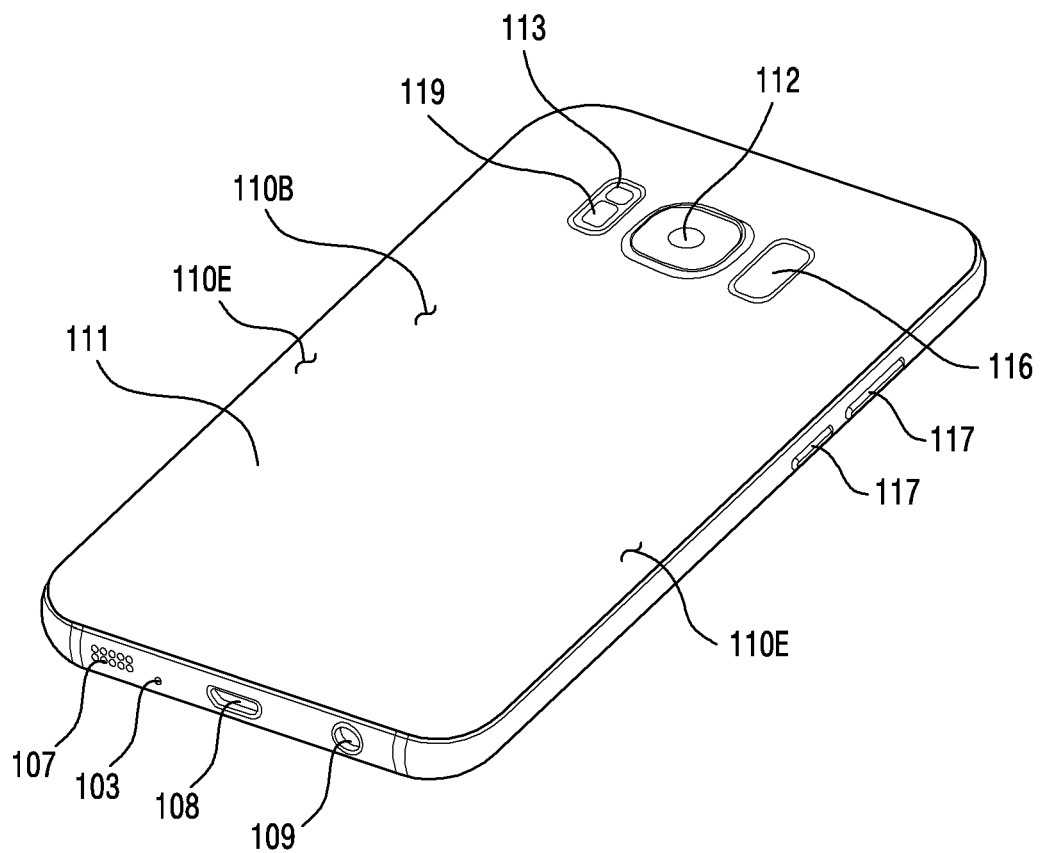
FIG. 2 is a perspective view illustrating a rear surface of the electronic device of FIG. 1 according to various embodiments of the disclosure.

FIG. 1 is a front side perspective view illustrating an electronic device 100 according to various embodiments. FIG. 2 is a rear side perspective view illustrating the electronic device 100 according to various embodiments.

Figure 3:
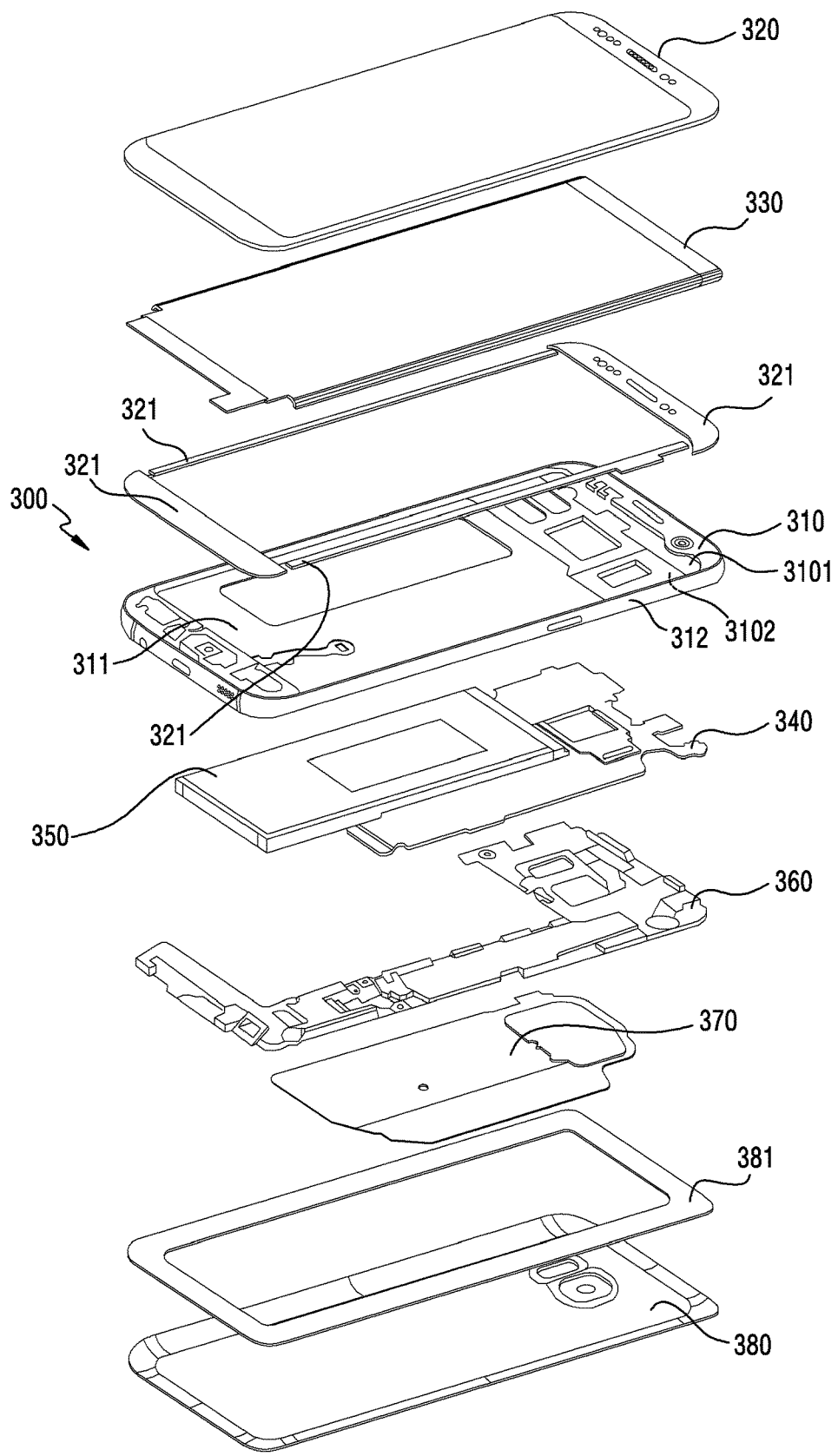
FIG. 3 is an exploded perspective view illustrating the electronic device of FIG. 1 according to various embodiments of the disclosure.

Referring to FIGS. 2 and 3, the electronic device 100 according to an embodiment may include a housing 110 including a first face (or a front face) 110A, a second face (or a rear face) 110B, and a side face 110C surrounding the space between the first face 110A and the second face 110B. In another embodiment (not illustrated), the term "housing" may refer to a structure forming some of the first face 110A, the second face 110B, and the side face 110C of FIG. 1. According to an embodiment, at least a portion of the first face 110A may be formed of a substantially transparent front plate 102 (e.g., a glass plate or a polymer plate including various coating layers). The second face 110B may be formed by a substantially opaque rear plate 111. The rear plate 111 may be formed of, for example, coated or colored glass, ceramic, polymer, or metal (e.g., aluminum, stainless steel (STS), or magnesium), or a combination of two or more of these materials. The side face 110C may be formed by a side bezel structure 118 (or a "side member") coupled to the front plate 102 and the rear plate 111 and including a metal and/or a polymer. In some embodiments, the rear plate 111 and the side bezel structure 118 may be integrally formed, and may include the same material (e.g., a metal material such as aluminum).

In the illustrated embodiment, the front plate 102 may include, at the long opposite side edges thereof, two first areas 110D, which are bent from the first face 110A towards the rear plate 111 and extend seamlessly. In the illustrated embodiment (see FIG. 2), the rear plate 111 may include, at the long opposite side edges thereof, two second areas 110E, which are bent from the second face 110B towards the front plate 102 and extend seamlessly. In some embodiments, the front plate 102 (or the rear plate 111) may include only one of the first areas 110D (or the second areas 110E). In another embodiment, some of the first areas 110D and the second areas 110E may not be included. In the embodiments described above, when viewed from a side of the electronic device 100, the side bezel structure 118 may have a first thickness (or width) on the side faces, which do not include the first areas 110D or the second areas 110E, and may have a second thickness (or width), which is smaller than the first thickness, on the side faces, which include the first areas 110D or the second areas 110E.

According to an embodiment, the electronic device 100 may include at least one of a display 101, audio modules 103, 107, and 114, sensor modules 104, 116, and 119, camera modules 105, 112, and 113, key input devices 117, light-emitting elements 106, and connector holes 108 and 109. In some embodiments, at least one of the components (e.g., the key input devices 117 or the light-emitting elements 106) may be omitted from the electronic device 100, or the electronic device 100 may additionally include other components.

According to an embodiment, the display 101 may be exposed through a large portion of, for example, the front plate 102. In some embodiments, at least a portion of the display 101 may be exposed through the front plate 102 forming the first face 110A and the first areas 110D of the side faces 110C. In some embodiments, the edges of the display 101 may be formed to be substantially the same as the shape of the periphery of the front plate 102 adjacent thereto. In another embodiment (not illustrated), the distance between the periphery of the display 101 and the periphery of the front plate 102 may be substantially constant in order to enlarge the exposed area of the display 101.

In another embodiment (not illustrated), a recess or an opening may be formed in a portion of the screen display area of the display 101, and at least one of the audio module 114, the sensor module 104, the camera module 105, and the light-emitting elements 106 may be aligned with the recess or the opening. In another embodiment (not illustrated), the rear face of the screen display area of the display 101 may include at least one of the audio module 114, the sensor module 104, the camera module 105, the fingerprint sensor 116, and the light-emitting elements 106. In another embodiment (not illustrated), the display 101 may be coupled to or disposed adjacent to a touch-sensitive circuit, a pressure sensor that is capable of measuring a touch intensity (pressure), and/or a digitizer that detects a magnetic-field type stylus pen. In some embodiments, at least some of the sensor modules 104 and 519 and/or at least some of the key input devices 117 may be disposed in the first areas 110D and/or the second areas 110E.

According to an embodiment, the audio modules 103, 107, and 114 may include a microphone hole 103 and speaker holes 107 and 114. The microphone hole 103 may include a microphone disposed therein so as to acquire external sound, and in some embodiments, multiple microphones may be disposed therein so as to detect the direction of sound. The speaker holes 107 and 114 may include an external speaker hole 107 and a phone call receiver hole 114. In some embodiments, the speaker holes 107 and 114 and the microphone hole 103 may be implemented as a single hole, or a speaker may be included without the speaker holes 107 and 114 (e.g., a piezo speaker).

According to an embodiment, the sensor modules 104, 116, and 119 may generate an electrical signal or a data value corresponding to the internal operating state or the external environmental state of the electronic device 100. The sensor modules 104, 116, and 119 may include, for example, a first sensor module 104 (e.g., a proximity sensor), a second sensor module (not illustrated) (e.g., a fingerprint sensor) disposed on the first face 110A of the housing 110, a third sensor module 119 (e.g., an HRM sensor), and/or a fourth sensor module 116 (e.g., a finger print sensor) disposed on the second face 110B of the housing 110. The fingerprint sensor may be disposed not only on the first face 110A of the housing 110 (e.g., the display 101), but also on the second face 110B. The electronic device 100 may further include at least one of sensor modules (not illustrated) such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

According to an embodiment, the camera modules 105, 112, and 113 may include, for example, a first camera device 105 disposed on the first face 110A of the electronic device 100 and a second camera device 112 and/or a flash 113 disposed on the second face 110B of the electronic device 100. The camera modules 105 and 112 may include one or more lenses, an image sensor, and/or an image signal processor. The flash 113 may include, for example, alight emitting diode or a xenon lamp. In some embodiments, two or more lenses (e.g., an infrared camera lens, a wide angle lens, and a telephoto lens) and image sensors may be disposed on one face of the electronic device 100.

According to an embodiment, the key input devices 117 may be disposed on the side face 110C of the housing 110. In another embodiment, the electronic device 100 may not include some or all of the above-mentioned key input devices 117, and a key input device 117, which is not included in the electronic device 100, may be implemented in another form, such as that of a soft key or the like, on the display 101. In some embodiments, the key input devices may include a sensor module 116 disposed on the second face 110B of the housing 110.

According to an embodiment, the light-emitting element 106 may be disposed on, for example, the first face 110A of the housing 110. The light-emitting element 106 may provide, for example, information about the state of the electronic device 100 in an optical form. In another embodiment, the light-emitting element 106 may provide a light source that is interlocked with, for example, the operation of the camera module 105. The light-emitting element 106 may include, for example, an LED, an IR LED, and a xenon lamp.

The connector holes 108 and 109 may include a first connector hole 108 that is capable of accommodating a connector (e.g., a USB connector) for transmitting and receiving power and/or data to and from an external electronic device, and/or a second connector hole 109 that is capable of receiving a connector (e.g., an earphone jack) for transmitting and receiving an audio signal to and from an electronic device.

FIG. 3 is an exploded perspective view illustrating an electronic device 100 according to various embodiments.

Referring to FIG. 3, an electronic device 100 (e.g., the electronic device 100 in FIG. 1) may include a side bezel structure 310, a first support member 331 (e.g., a bracket), a front plate 320, a display 330, a printed circuit board 340, a battery 350, a second support member 360 (e.g., a rear case), an antenna 370, and a rear plate 380. In some embodiments, at least one of the components (e.g., the first support member 331 or the second support member 360) may be omitted from the electronic device 100, or the electronic device 100 may additionally include other components. At least one of the components of the electronic device 100 may be the same as or similar to at least one of the components of the electronic device 100 of FIG. 1 or 2, and a redundant description thereof is omitted below.

According to an embodiment, the first support member 331 may be disposed inside the electronic device 100 so as to be connected to the side bezel structure 310, or the first support member 331 may be integrally formed with the side bezel structure 310. The first support member 331 may be formed of, for example, a metal material and/or a non-metal material (e.g., a polymer). The display 330 may be coupled to one face of the first support member 331, and the printed circuit board 340 may be coupled to the other face of the first support member 32. On the printed circuit board 340, a processor, memory, and/or an interface may be mounted. The processor may include at least one of, for example, a central processing unit (CPU), an application processor, a graphics processor, an image signal processor, a sensor hub processor, or a communication processor.

According to an embodiment, the memory may include, for example, volatile memory or nonvolatile memory.

According to an embodiment, the interface may include, for example, a high-definition multimedia interface (HDMI), a universal serial bus (USB) interface, an SD card interface, and/or an audio interface. The interface may electrically or physically connect, for example, the electronic device 100 to an external electronic device, and may include a USB connector, an SD card/an MMC connector, or an audio connector.

According to an embodiment, the battery 350 is a device for supplying power to at least one component of the electronic device 100, and may include, for example, a non-rechargeable primary battery, a rechargeable secondary battery, or a fuel cell. At least a portion of the battery 350 may be disposed on substantially the same plane as, for example, the printed circuit board 340. The battery 350 may be integrally disposed within the electronic device 100, or may be detachably mounted on the electronic device 100.

According to an embodiment, the antenna 370 may be disposed between the rear plate 380 and the battery 350. The antenna 370 may include, for example, a nearfield communication (NFC) antenna, a wireless charging antenna, and/or a magnetic secure transmission (MST) antenna. The antenna 370 may perform short-range communication with, for example, an external electronic device, or may transmit/ receive power required for charging to/from the external device in a wireless manner. In another embodiment, an antenna structure may be formed by the side bezel structure 310, a portion of the first support member 331, or a combination thereof.

According to various embodiments, the electronic device 300 may include a waterproof structure. According to an embodiment, the electronic device 300 may include at least one seal member 321 and 381 for waterproofing therein. According to an embodiment, the at least one waterproof layer 321 may be disposed between the display 330 and the side bezel structure 310 in at least a region of the electronic device 300 in which the display 330 is disposed. According to an embodiment, at least one waterproof layer 321 may be disposed between the front plate 320 and the side bezel structure 310 in a region where the display 330 of the electronic device 300 is excluded. According to an embodiment, at least one waterproof layer 381 may be disposed between the rear plate 380 and the side bezel structure 310. According to an embodiment, the at least one waterproof layer 321 may be divided and disposed into a plurality of waterproof layers due to a step difference between the rear surface of the front plate 320 and the area of the display 330. According to an embodiment, a waterproof structure may be additionally formed in a space between a plurality of waterproof layers (usually a stepped area) by a separate waterproof filling member. According to an embodiment, the at least one waterproof layer 321, 381 may include at least one of tape, adhesive, waterproof dispensing, silicone, waterproof rubber, and urethane.

According to various embodiments, at least a portion of the side bezel structure 310 may be formed of a conductive material. According to an embodiment, the side bezel structure 310 includes a first surface 3101 facing a first direction (for example, a display direction), a second surface 3102 facing a direction opposite to the first surface 3101, and It may include a side member 312 (for example, an outer housing) surrounding the space between the first surface 3101 and the second surface 3102. According to an embodiment, at least a portion of the side member 312 may be disposed along the periphery of the electronic device 300 to be exposed to the outside. According to an embodiment, the rear plate 380 may be attached to the second surface 3102 of the side bezel structure 310 by a waterproof layer 381 disposed between the side bezel structure 310 and the rear plate 380.

According to various embodiments, the front plate 320 may be formed of a transparent material (for example, a glass plate), and a printing structure (for example, a printing film 400 of FIG. 4) attached to at least a portion of the front plate 320. According to one embodiment, the printing structure (for example, the printing film 400 of FIG. 4) may have at least one specific color and/or metallic feel, and may be disposed to be visible through at least a part of the front plate 320. have. According to an embodiment, the printing structure may be disposed on at least a portion of the rear plate 380.

According to various embodiments, the waterproof layer 321 has a printed structure (for example, the printing film 400 of FIG. 4) between the first surface 3101 and the front plate 320 of the side bezel structure 310 may be attached to at least some areas. In this case, the printing structure (for example, the printing film 400 of FIG. 4) is an adhesive improvement layer (for example, FIG. 4) according to exemplary embodiments of the present invention on a contact surface in contact with the waterproof layer 321. The adhesion improvement layer 406 of 5b may be included. According to an embodiment, the adhesion improving layer (for example, the adhesion improving layer 406 of FIG. 5B) may improve adhesion between the waterproof layer 321 and the printing structure (for example, the printing film 400 of FIG. 4), It can be quantified and set to have a desired adhesion and/or adhesion. In another embodiment, the printing structure may be disposed in a manner that is directly stacked on the rear surface of the front plate 320 rather than a separate film member attached to the front plate 320.

Figure 4:
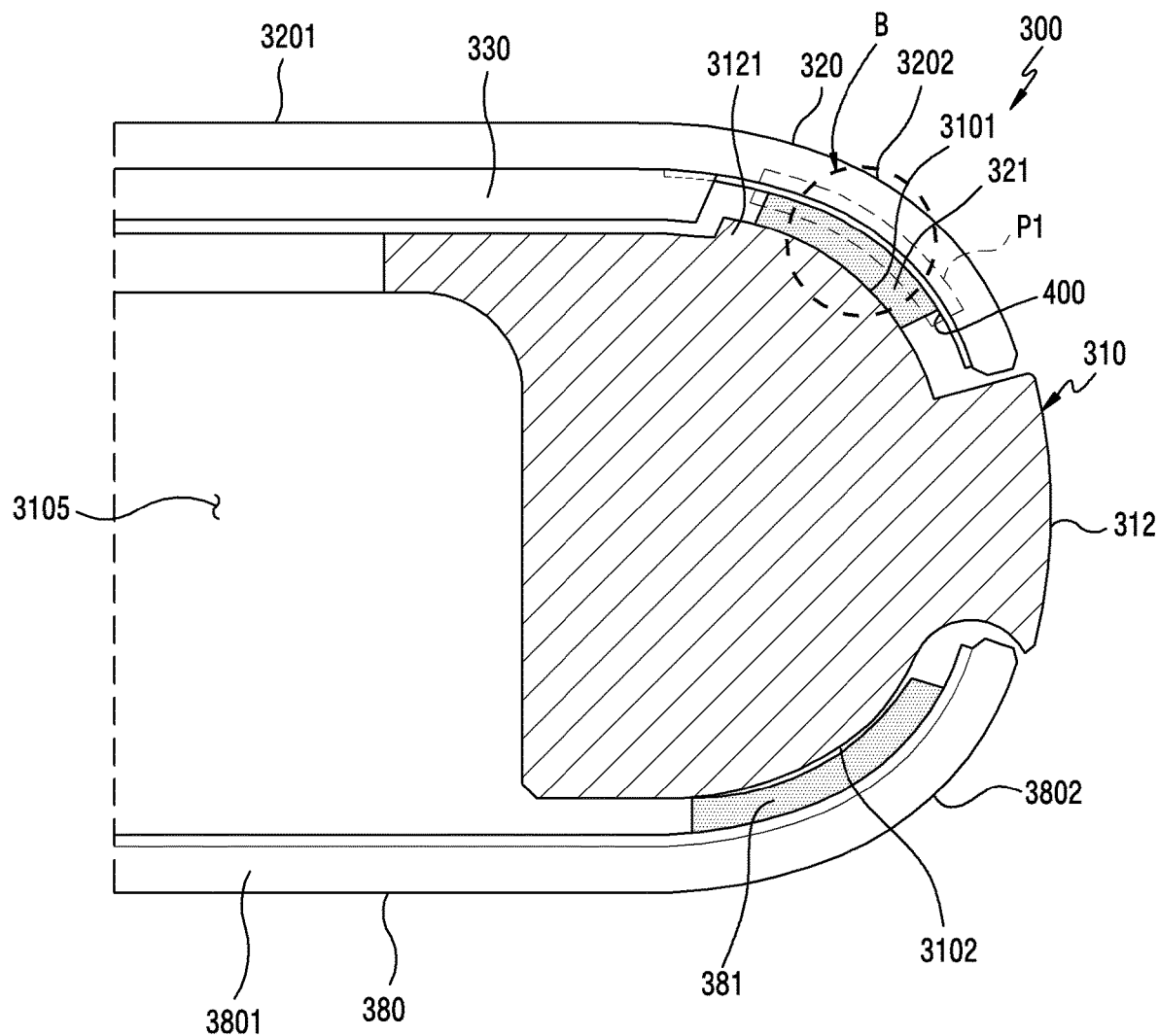
FIG. 4 is a cross-sectional view illustrating the electronic device, taken along line A-A of FIG. 1 according to various embodiments of the disclosure.

FIG. 4 is a cross-sectional view illustrating the electronic device 300, taken along line A-A of FIG. 1 according to various embodiments of the disclosure.

The electronic device 300 of FIG. 4 may be partly similar to the electronic device 100 of FIG. 1 or may include other embodiments of an electronic device.

Referring to FIG. 4, the electronic device 300 may include an outer housing (e.g., a side bezel structure 310) including a front plate 320 facing a first direction (e.g., a direction of the front plate 320 of FIG. 3), a rear plate 380 facing an opposite direction to the front plate 320, and a side member 3212 surrounding a space 3105 between the front plate 320 and the rear plate 380. According to an embodiment, at least a partial area of the front plate 320 may be formed of a transparent material. According to an embodiment, the front plate 320 may be formed of glass, sapphire, acryl, or reinforced plastic. According to an embodiment, the side member 312 may include a first surface 3101 protruding toward the space 3105 and facing the first direction and a second surface 3102 facing an opposite direction to the first surface 3101. According to an embodiment, the first surface 3101 may be disposed in a protrusion 3121 extending from the side member 312 toward the interior space 3105 of the electronic device 300.

According to various embodiments, the front plate 320 may include a flat portion 3201 and a curved portion 3202 extending from the flat portion 3201. According to an embodiment, the electronic device 300 may include a waterproof layer 321 (e.g., a first waterproof layer) disposed between the front plate 320 and the first surface 3101 of the outer housing (e.g., the size bezel structure 310). According to an embodiment, the waterproof layer 321 may be disposed at at least a first portion P1 between the front plate 320 and the first surface 3101. According to an embodiment, the electronic device 300 may include a printing structure disposed between the waterproof layer 321 and the front plate 320. According to an embodiment, the printing structure may include a printing film 400 attached to a rear surface of the front plate 320. According to an embodiment, the printing film 400 may include a plurality of layers. According to an embodiment, when the front plate 320 is viewed from the top, the waterproof layer 321 and the printing film 400 may be disposed at a location including the flat portion 3201 of the front plate 320, the curved portion 3202 of the front plate 320, or a border portion of the flat portion 3201 and the curved portion 3202. According to an embodiment, the printing film 400 may extend to a location of the flat portion 3201 of the front plate 320, which overlaps at least a partial area of the display 330. In this case, the printing film 400 may extend to an inactive area (e.g., a black matrix (BM)) of the display 330 at the flat portion 3201 of the front plate 320.

According to another embodiment, the waterproof layer 321 and the printing film 400 may be applied to a front plate including only a flat portion or a front plate (e.g., a 2.5D front plate) in which only at least a partial edge portion of the outer surface is curved.

According to various embodiments, the electronic device 300 may include another waterproof layer 381 (e.g., a second waterproof layer) disposed between the first surface 3101 and the rear plate 380 of the outer housing (e.g., the size bezel structure 310). According to an embodiment, the another waterproof layer 381 may also include a flat portion 3801 and a curved portion 3802 formed in the rear plate 380, or a border portion of the flat portion 3801 and the curved portion 3802. According to an embodiment, the rear plate 380 may be formed of glass, sapphire, acryl, or reinforced plastic.

Figure 5A:
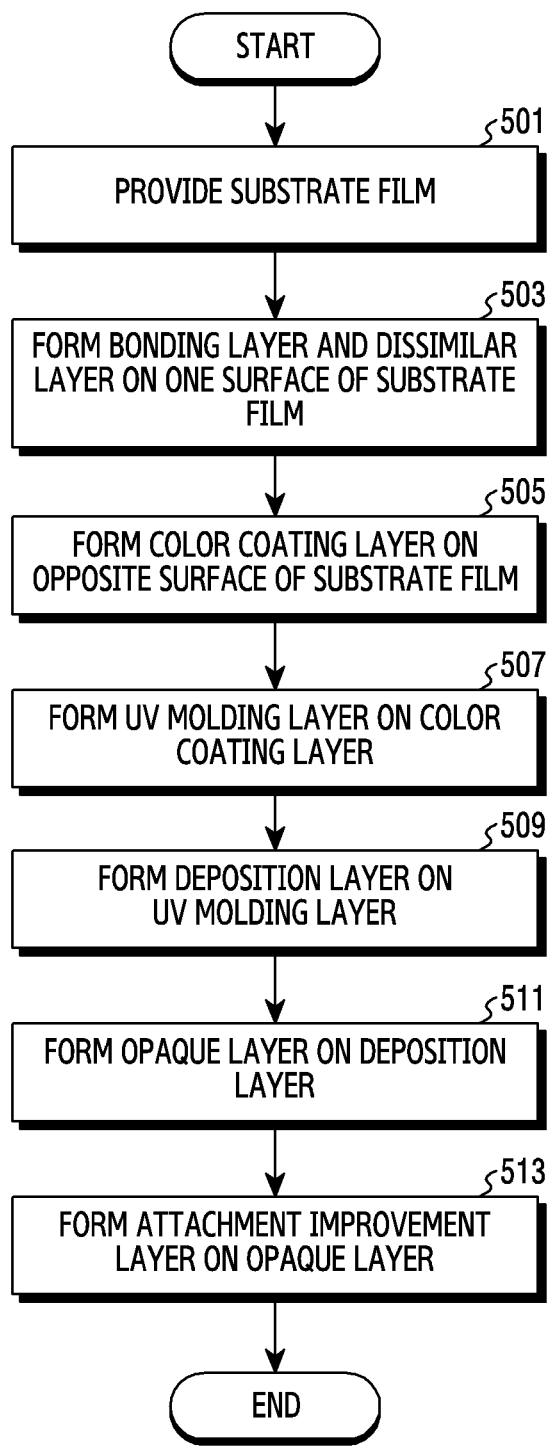
FIG. 5A is a flowchart illustrating a process of manufacturing a printing structure according to various embodiments of the disclosure.
Figure 5B:
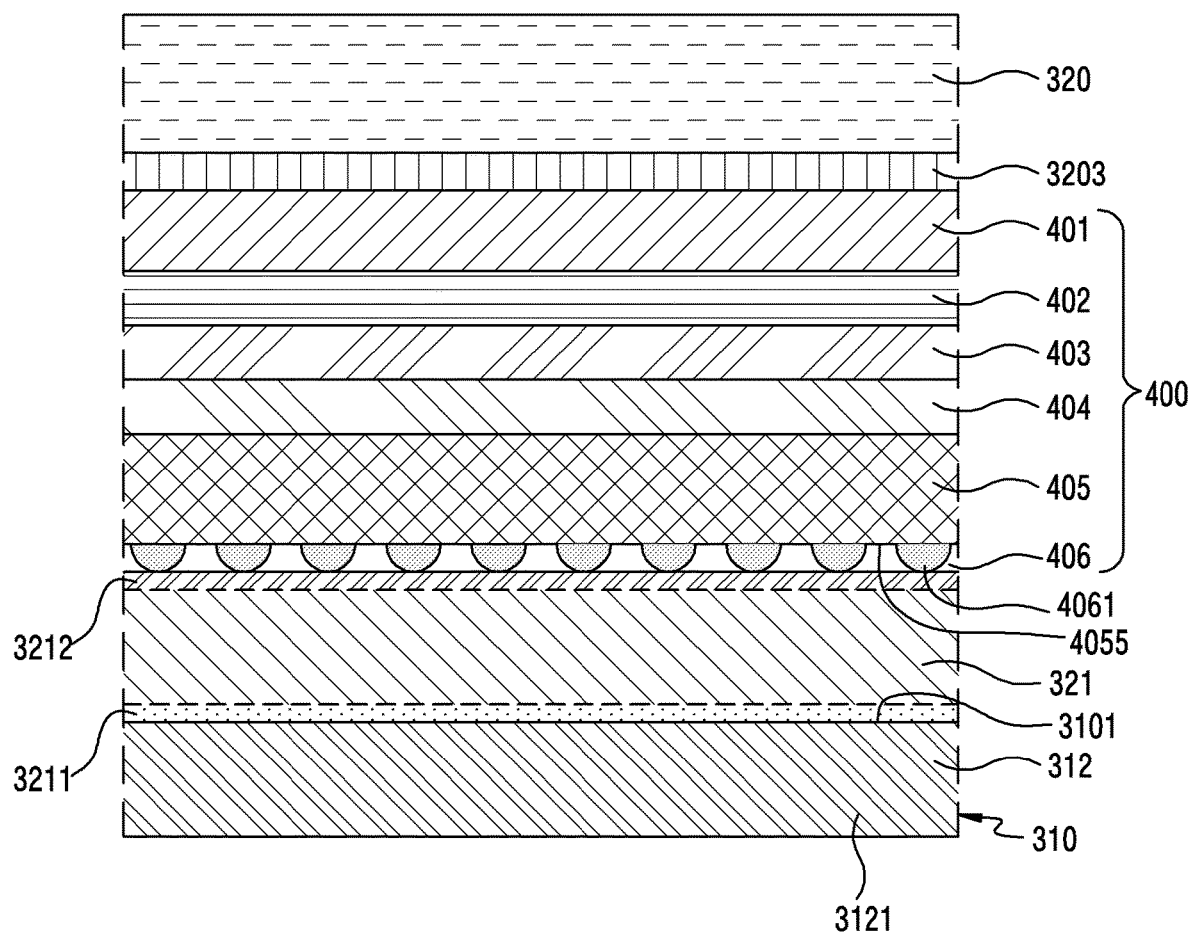
FIG. 5B is a cross-sectional view illustrating area B of the electronic device of FIG. 4 according to various embodiments of the disclosure in detail.

According to various embodiments, the printing film 400 may include an opaque layer (e.g., an opaque layer 405 of FIG. 5B). According to an embodiment, the opaque layer (e.g., the opaque layer 405 of FIG. 5B) may include a plurality of shielding/printing layers (e.g., a four-color printing layer). According to an embodiment, the opaque layer (e.g., the opaque layer 405 of FIG. 5B) may include a second surface (e.g., a second surface 4055 of FIG. 5B) facing the first surface 3101 of the protrusion 3121. According to an embodiment, the printing film 400 may include an adhesive improvement layer (e.g., an adhesive improvement layer 406 of FIG. 5B) formed on the second surface (e.g., the second surface 4055 of FIG. 5B) and including a plurality of repeated patterns 4061 (e.g., a unit pattern). According to an embodiment, the adhesive improvement layer (e.g., the adhesive improvement layer 406 of FIG. 5B) may be attached to the waterproof layer 321.

According to various embodiments, the adhesive improvement layer (e.g., the adhesive improvement layer 406 of FIG. 5B) may be formed to include various shapes of unit patterns to improve an attachment force with the waterproof layer on the second surface of the opaque layer (e.g., the opaque layer 405 of FIG. 5B) and for quantification. According to an embodiment, the adhesive improvement layer (e.g., the adhesive improvement layer 406 of FIG. 5B) may include an attachment layer formed on the second surface (e.g., the second surface 4055 of FIG. 5B) of the opaque layer (e.g., the opaque layer 405 of FIG. 5B). According to an embodiment, the adhesive improvement layer (e.g., the adhesive improvement layer 406 of FIG. 5B) may include an additive such as an acrylic resin and silicon beads (e.g., having the sizes of 17 µm to 20 µm)

Hereinafter, a configuration of the printing film 400 will be described in detail.

FIG. 5A is a flowchart illustrating a process of manufacturing a printing film 400 according to various embodiments of the disclosure. FIG. 5B is a cross-sectional view illustrating area B of the electronic device 300 of FIG. 4 according to various embodiments of the disclosure in detail.

The sequences of the operations (e.g., operations 501 to 513) suggested in FIG. 5A may be at least partly changed or some of the operations may be omitted.

Referring to FIGS. 5A and 5B, in operation 501, a substrate film 401 may be provided. According to an embodiment, the substrate film 401 may be formed of a transparent material. According to an embodiment, the substrate film 401 may be formed of glass, a metal, a complex material, or a polymeric material (e.g., polyethylene terephthalate (PET)).

According to various embodiments, in operation 503, an optical clear adhesive (OCA) layer 3203 and a dissimilar layer (not illustrated) may be disposed on one surface of the substrate film 401. According to an embodiment, the dissimilar layer may include a delamination tape for delamination, which is attached to the optical clear adhesive (OCA) layer 3203 formed to be bonded to the front plate 320. However, the disclosure is not limited thereto, and the substrate film 401 may be disposed to be attached first to the front plate 320 via the OCA layer 3203.

According to various embodiments, in operation 505, a color coating layer 402 may be disposed on an opposite surface of the substrate film 401. According to an embodiment, the color coating layer 402 may determine the color of the printing film 400 projected through the front plate 320. According to an embodiment, the color coating layer 402 may be formed of a material that may form a painting layer in all ranges in which curing reactions of, for example, a UV ray, urethane, a curing type paint, an SF paint, and a water paint are made, according to materials and environments. According to an embodiment, the color coating layer 402 may include a fluidic paint including a resin, a solvent, a pigment/dye, and an additive. According to an embodiment, the color coating layer 402 may include a single layer or multiple layers according to materials and products. According to an embodiment, for the color of the color coating layer 402, a paint including an organic/inorganic pigment, an organic dye, silver, and pearl may be used. According to an embodiment, the color coating layer 402 may be formed via a slit coating method and a UV curing method, which are known.

According to various embodiments, in operation 507, a molding layer 403 (e.g., an ultraviolet ray molding layer) may be disposed on the color coating layer 402. According to an embodiment, the molding layer 403 may be formed of a material that helps form at least one deposition layer 404 laminated thereon and helps attach the deposition layer 404. According to an embodiment, the molding layer 403 may have a single layer or multiple layers. According to an embodiment, the molding layer 403 may be formed of acryl, olefin, an urethane-based resin or other resins, and may be formed by painting a paint of a UV type or urethane curing type according to a curing method. According to an embodiment, the molding layer 403 may be formed of at least one of a chlorinated polyolefin (CPO)-based resin (e.g., a CPO_C1 type primer), an acryl modified resin, and a UV curing resin. According to an embodiment, the molding layer 403 may be cured via a process using an oven or natural drying, or an ultraviolet ray curing method.

According to various embodiments, in operation 509, at least one deposition layer 404 may be disposed on an upper surface of the molding layer 403. According to an embodiment of the disclosure, the deposition layer 404 may be formed on the molding layer 403 to be laminated on the molding layer 403 after the molding layer 403 is cured. According to an embodiment, the method for depositing the deposition layer 404 may include an E-beam evaporation method, a physical vapor deposition (PVD) method, or a chemical vapor deposition (CVD) method. According to an embodiment, the deposition layer 404 may be formed of at least one of a Sn-based material, a Ti-based material, a Cr-based material, or an Al-based material. According to an embodiment, the deposition film 404 may include at least one of $TiO_2$, $TiN$, $TiCN$, $SiO_2$, $Al_2O_3$, $ZrO_2$, $Ta_2O_5$, In, or $Nb_2O_5$. According to an embodiment, the at least one deposition film 404 may be deposited by alternately using two or more deposition materials. According to an embodiment, the at least one deposition film 404 may be formed by alternately depositing a first deposition material that achieves a first refractivity by mixing at least two deposition materials, and a second deposition material that achieves a second refractivity that is different from the first refractivity. For example, the refractivity of a silicon oxide ($SiO_2$) film is 1.4, the refractivity of a titanium oxide (TiO2) film is 2.4, and the refractivity of an aluminum oxide (Al2O3) film is 1.7. Accordingly, if a silicon oxide (SiO2) film and a titanium oxide (TiO2) film, the refractivity difference of which is large, is alternately deposited, the corresponding deposition layer may be very advantageous in a ceramic pearl texture effect and an anisotropic color reproduction effect.

According to various embodiments, in operation 511, an opaque layer 405 may be disposed on the deposition layer 404. According to an embodiment, the opaque layer 405 may have at least one layer (e.g., a four-color printing layer) by using an ink of a black color that is the ground color of the printing film 400. According to an embodiment, the opaque layer 405 may be cured via a thermal drying method after being printed via a screen mask printing method. For example, the four-color printing layer may be formed via repeated processes of printing and drying processes for each printing layer.

According to various embodiments, in operation 513, the adhesive improvement layer 406 may be disposed on the opaque layer 405 (e.g., the second surface 4055). According to an embodiment, the adhesive improvement layer 406 may be disposed to improve an attachment force and/or a bonding force with the waterproof layer 321 (e.g., a waterproof member) attached to the rear surface of the front plate 320. According to an embodiment, the adhesive improvement layer 406 may include an additive such as an acrylic resin or silicon beads dispersed in the acrylic resin. According to an embodiment, the adhesive improvement layer 406 may include a pigment or a dye. According to an embodiment, the adhesive improvement layer 406 may include a plurality of repeated patterns 4061. For example, the plurality of repeated patterns 4061 may have a specific shape. According to an embodiment, the plurality of repeated patterns 4061 may have a predetermined interval. For example, the attachment force and/or the bonding force of the adhesive improvement layer 406 with the waterproof layer 321 may be quantified according to the shape of the plurality of repeated patterns 4061, the intervals of the patterns, or the number of patterns. According to an embodiment, because the attachment force and/or the bonding force with the waterproof layer 321 is quantified by the plurality of repeated patterns 4061, the attachment force with the waterproof layer 321 can be improved. Further, an attachment and/or a bonding force, by which the printing film 400 may be easily delaminated from the waterproof layer 321 when the electronic device is maintained and repaired, may be set. According to an embodiment, the adhesive improvement layer 406 may be configured such that when the printing film 400 is applied to the curved portion (e.g., the curved portion 3202 of FIG. 4) of the front plate 320, an attachment force and/or a bonding force is improved while stress is prevented from being concentrated at the curved portion 3202 by the plurality of repeated patterns 4061.

According to various embodiments, the waterproof layer 321 may include a first bonding layer 3211 bonded to the protrusion 3121 of the outer housing (e.g., the side bezel structure 310), and a second bonding layer 3212 disposed at a location that is opposite to the first bonding layer 3211 and attached to the adhesive improvement layer 406. According to an embodiment, the attachment force and/or the bonding force between the printing film 400 and the outer housing (e.g., the side bezel structure 310) may be determined according to the second surface 4055 of the opaque layer 405 and the outer surfaces of the repeated patterns 4061, which contact with the second bonding layer 3212.

According to another embodiment, in a state in which the OCA layer 3203 and the substrate film 401 are excluded, the color coating layer 402 may be directly deposited or printed on the rear surface of the front plate 320.

Figure 6:
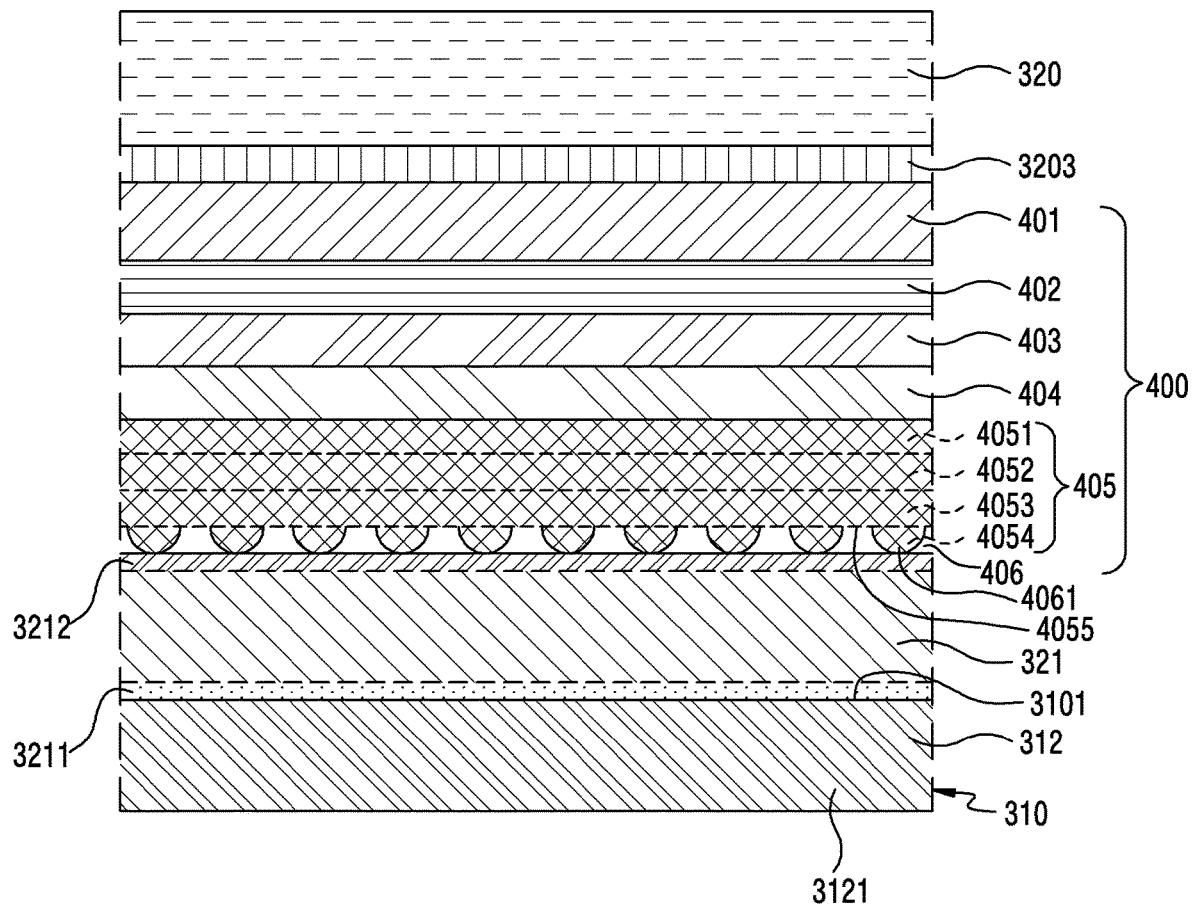
FIG. 6 is a cross-sectional view of the printing structure according to various embodiments of the disclosure.

FIG. 6 is a cross-sectional view of a printing film 400 according to various embodiments of the disclosure.

Referring to FIG. 6, the adhesive improvement layer 406 may include a plurality of repeated patterns 4061 repeatedly formed on the second surface 4055 of the opaque layer 405, not separately but directly. According to an embodiment, the opaque layer 405 may include a plurality of printing layers 4051, 4052, 4053, and 4054. For example, after the first to third color printing layers 4051, 4052, and 4053 of the total four-color printing layer are sequentially laminated, the fourth color printing layer 4054 that contacts the waterproof layer 321 may be finally laminated to form an adhesive improvement layer having a plurality of repeated patterns. According to an embodiment, the opaque layer 405 may be formed through a screen printing method, a gravure offset method, or a reverse offset method, which are known.

Figure 7A:
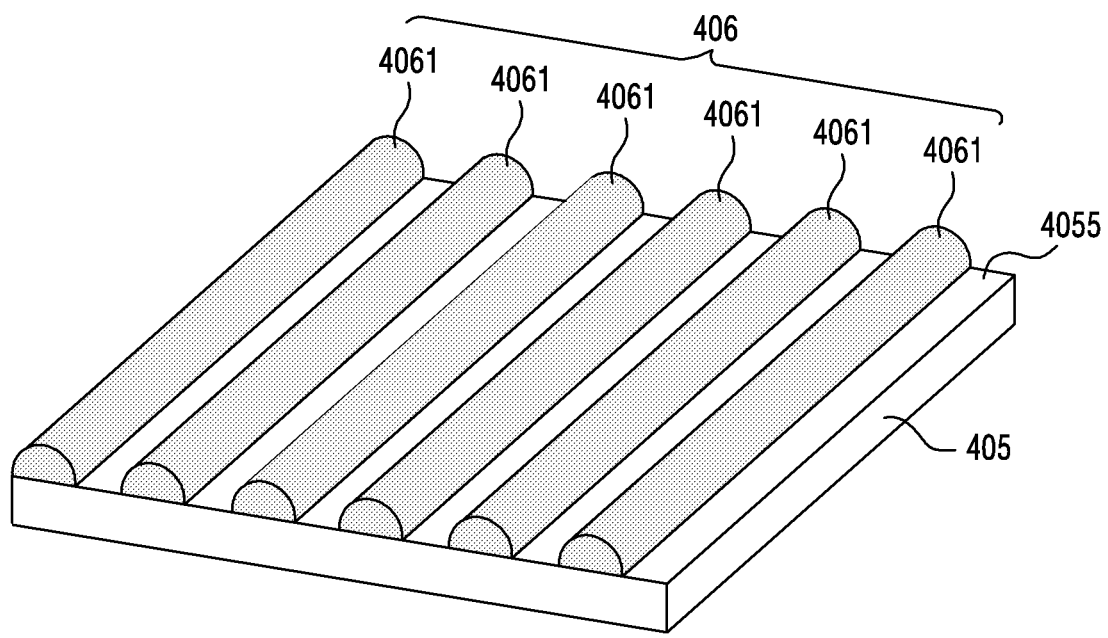
FIG. 7A is a perspective view illustrating a configuration of an adhesive improvement layer according to various embodiments of the disclosure.
Figure 7B:
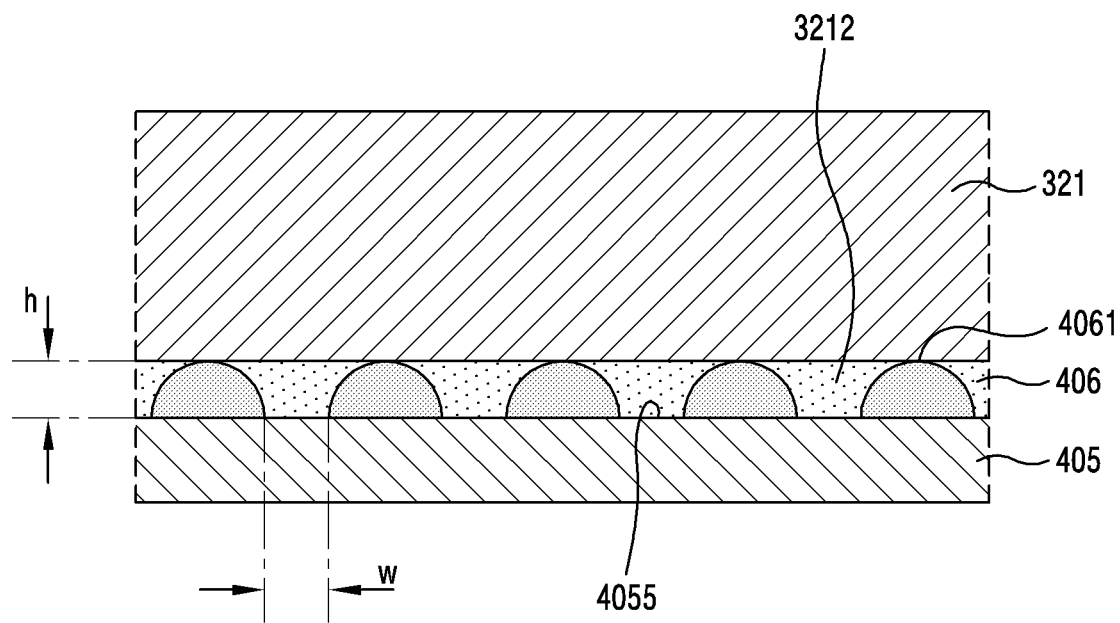
FIG. 7B is a cross-sectional view illustrating a state in which a waterproof layer is attached to the adhesive improvement layer of FIG. 7A according to various embodiments of the disclosure.

FIG. 7A is a perspective view illustrating a configuration of an adhesive improvement layer according to various embodiments of the disclosure. FIG. 7B is a cross-sectional view illustrating a state in which a waterproof layer is attached to the adhesive improvement layer of FIG. 7A according to various embodiments of the disclosure.

Referring to FIGS. 7A and 7B, an adhesive improvement layer 406 including a plurality of repeated patterns 4061 may be disposed on the second surface 4055 of the opaque layer 405. According to an embodiment, the plurality of repeated patterns 4061 may have a predetermined interval w and a predetermined height h. According to an embodiment, when the cross-sections of the plurality of repeated patterns 4061 are semicircular dots, the height h may include the diameters of the dot patterns. According to an embodiment, as illustrated, the adhesive improvement layer 406 may include a plurality of striped repeated patterns formed at a predetermined height h to have a length at a predetermined interval w.

According to various embodiments, the adhesive improvement layer 406 may be attached to the waterproof layer 321. According to an embodiment, when the adhesive improvement layer 406 is attached to the waterproof layer 321, a bonding surface may be formed in the second bonding layer 3212 of the waterproof layer 321 to contact the outer surfaces of the repeated patterns 4061 protruding from the second surface 4055 of the opaque layer 405. Accordingly, an attachment force and/or a bonding force of the second bonding layer 3212 may be quantitatively set by adjusting the shapes and the number of the plurality of repeated patterns 4061 formed on the second surface 4055 of the opaque layer 405.

FIGS. 8A to 8H are perspective views illustrating configurations of adhesive improvement layers 406 according to various embodiments of the disclosure.

The adhesive improvement layers of FIGS. 8A to 8H may include a separate layer including a plurality of repeated patterns by using an attachment layer. According to another embodiment, in the adhesive improvement layer, a partial layer (e.g., the four-color printing layer) of the opaque layer may be formed to include a plurality of repeated patterns. In this case, because a separate attachment layer is not required, manufacturing costs can be reduced.

Figure 8A:
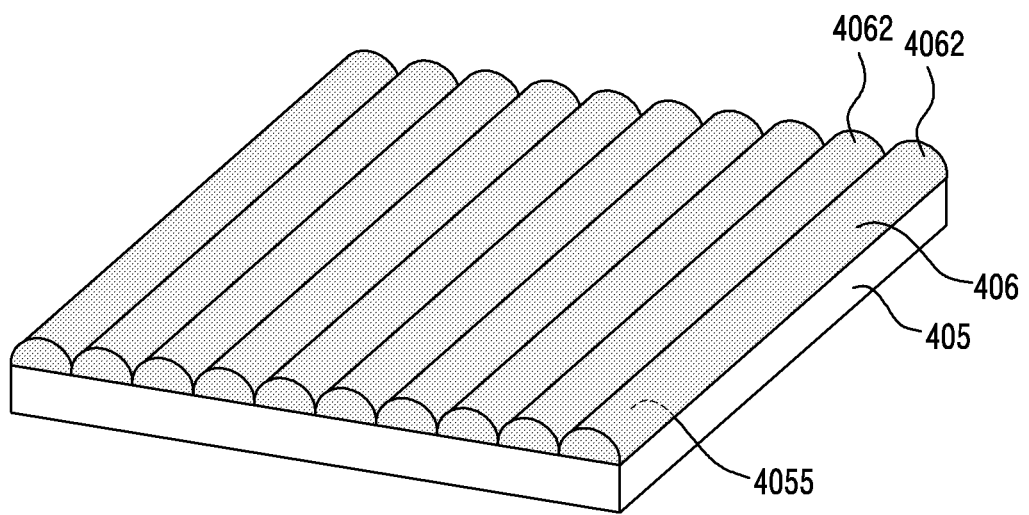
FIG. 8A is perspective views illustrating configurations of adhesive improvement layers according to various embodiments of the disclosure.

Referring to FIG. 8A, the adhesive improvement layer 406 disposed on the second surface 4055 of the opaque layer 405 may include a plurality of repeated patterns 4062 of a semicircular stripe shape, which is similar to those of FIG.

7A. According to an embodiment, the plurality of repeated patterns 4062 may be disposed adjacent to the adjacent patterns without any separate mutual intervals.

Figure 8B:
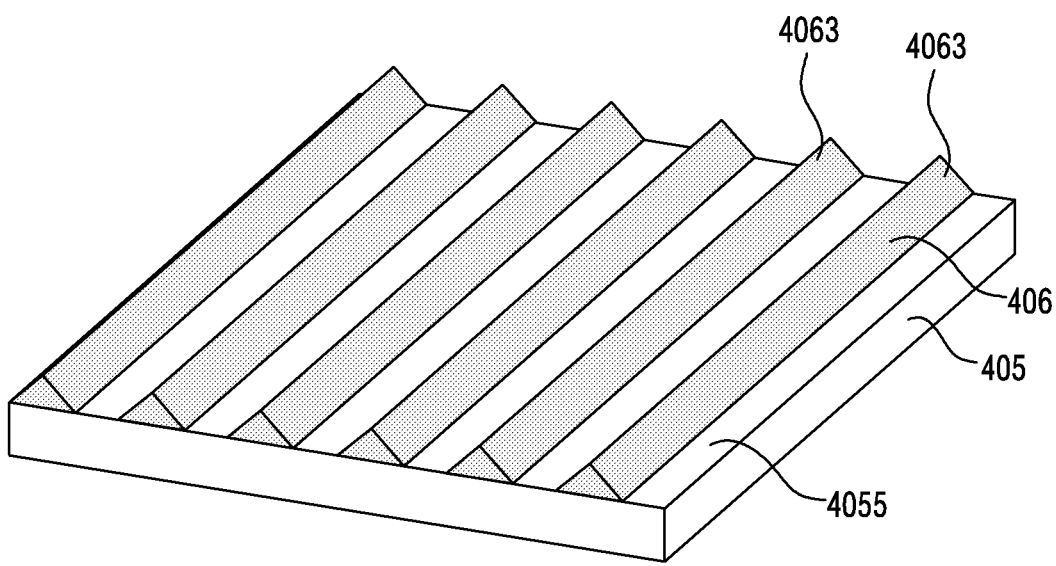
FIG. 8B is perspective views illustrating configurations of adhesive improvement layers according to various embodiments of the disclosure.

Referring to FIG. 8B, the adhesive improvement layer 406 disposed on the second surface 4055 of the opaque layer 405 may include a plurality of repeated patterns 4063, the cross-sections of which have a triangular stripe shape. According to an embodiment, the plurality of repeated patterns 4063 may be disposed on the second surface 4055 to be spaced apart from each other at a predetermined interval.

Figure 8C:
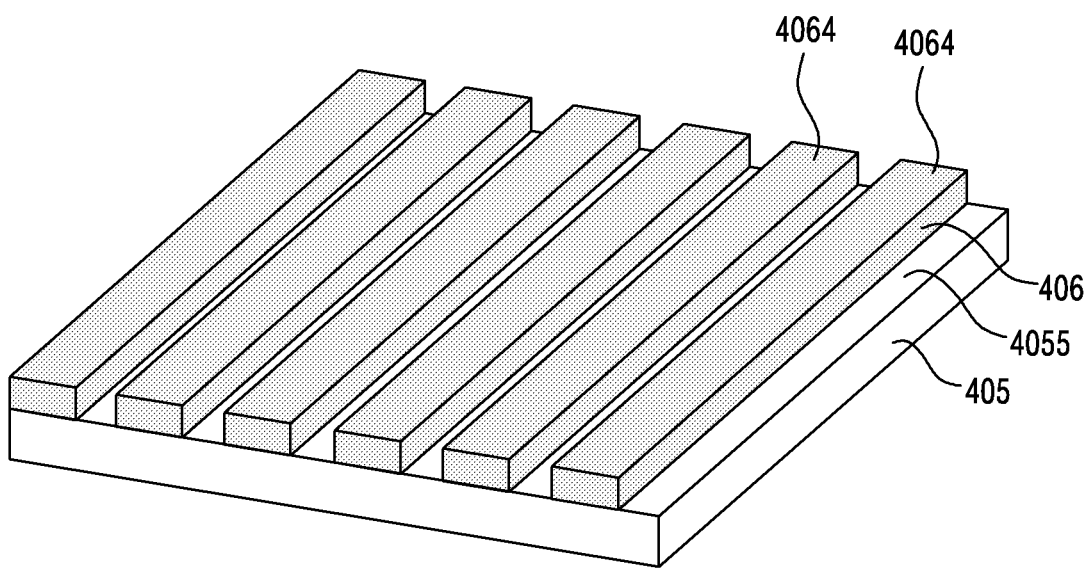
FIG. 8C is perspective views illustrating configurations of adhesive improvement layers according to various embodiments of the disclosure.

Referring to FIG. 8C, the adhesive improvement layer 406 disposed on the second surface 4055 of the opaque layer 405 may include a plurality of repeated patterns 4064, the cross-sections of which have a rectangular stripe shape. According to an embodiment, the plurality of repeated patterns 4064 may be disposed on the second surface 4055 to be spaced apart from each other at a predetermined interval. According to another embodiment, the adhesive improvement layer 406 may include a plurality of repeated patterns, the cross-sections of which have an N-polygonal stripe shape. According to an embodiment, the plurality of repeated patterns of the adhesive improvement layer 406 may have different shapes, and may be disposed not at a predetermined interval but at different intervals.

Figure 8D:
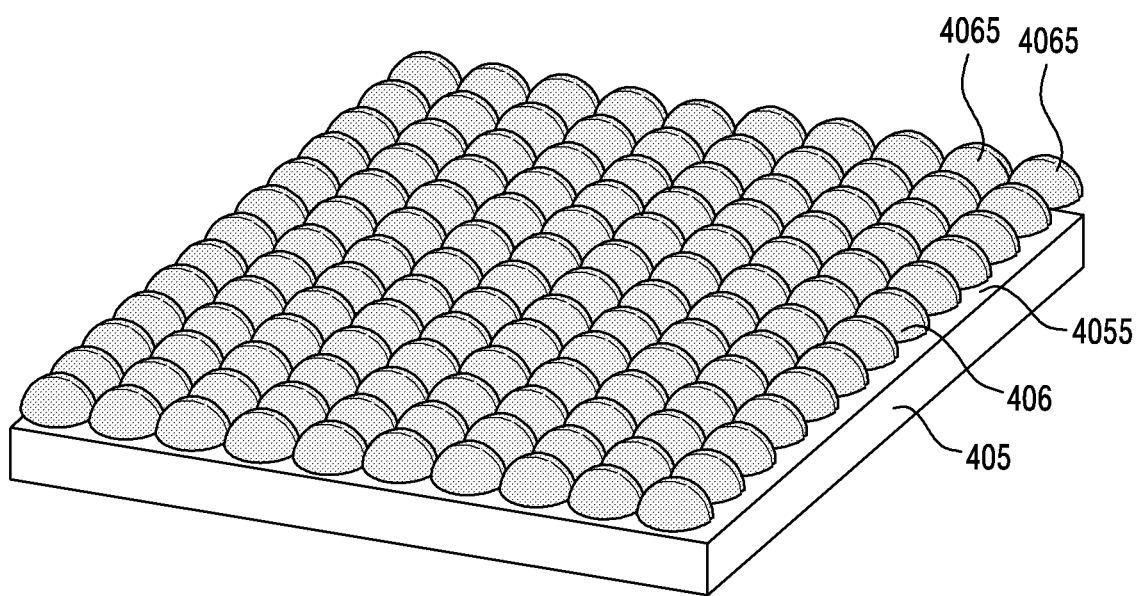
FIG. 8D is perspective views illustrating configurations of adhesive improvement layers according to various embodiments of the disclosure.

Referring to FIG. 8D, the adhesive improvement layer 406 disposed on the second surface 4055 of the opaque layer 405 may include a plurality of repeated patterns 4065 having a semispherical dot shape. According to an embodiment, the plurality of repeated patterns 4065 may be disposed adjacent to the adjacent patterns without any separate mutual intervals.

Figure 8E:
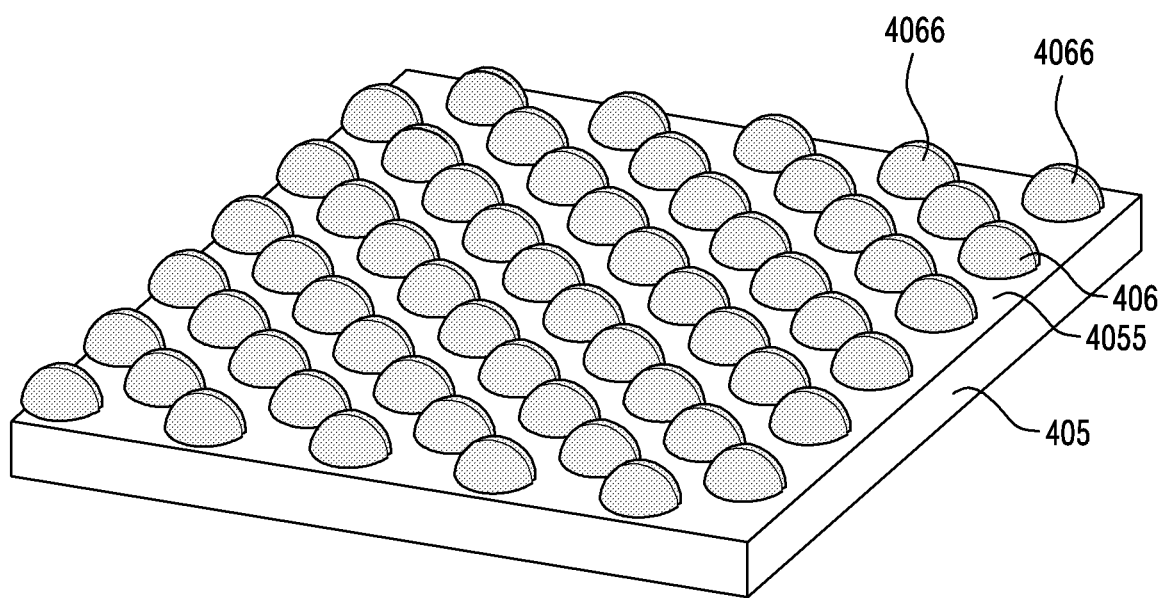
FIG. 8E is perspective views illustrating configurations of adhesive improvement layers according to various embodiments of the disclosure.

Referring to FIG. 8E, the adhesive improvement layer 406 disposed on the second surface 4055 of the opaque layer 405 may include a plurality of repeated patterns 4066 having a semispherical dot shape. According to an embodiment, the plurality of repeated patterns 4066 may be disposed on the second surface 4055 of the opaque layer 405 to be regularly spaced apart from each other.

Figure 8F:
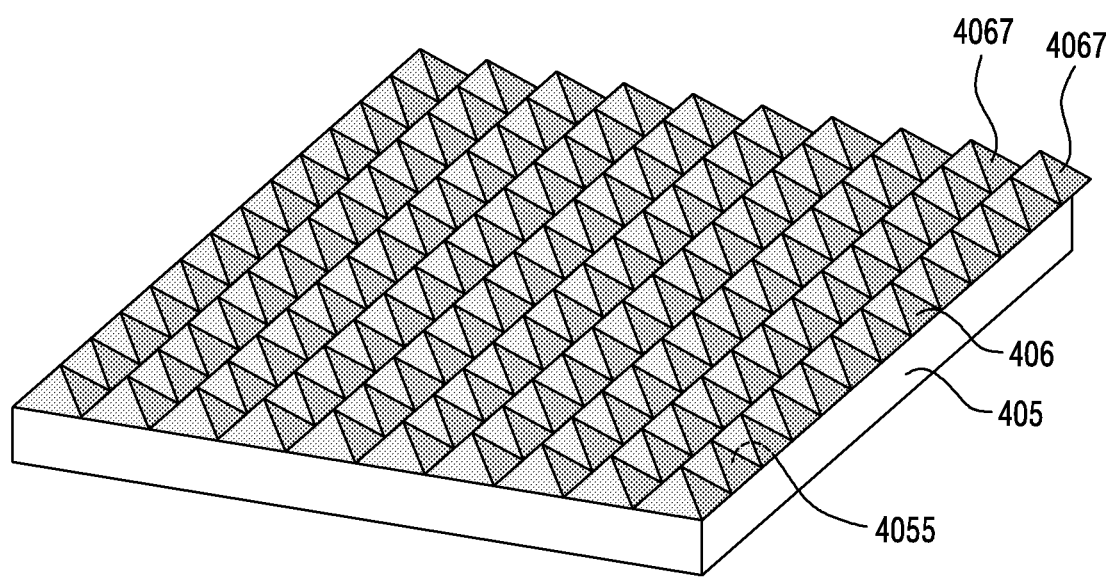
FIG. 8F is perspective views illustrating configurations of adhesive improvement layers according to various embodiments of the disclosure.

Referring to FIG. 8F, the adhesive improvement layer 406 disposed on the second surface 4055 of the opaque layer 405 may include a plurality of repeated patterns 4067 having a pyramid dot shape. According to an embodiment, the plurality of repeated patterns 4067 may be disposed adjacent to the adjacent patterns without any separate mutual intervals.

Figure 8G:
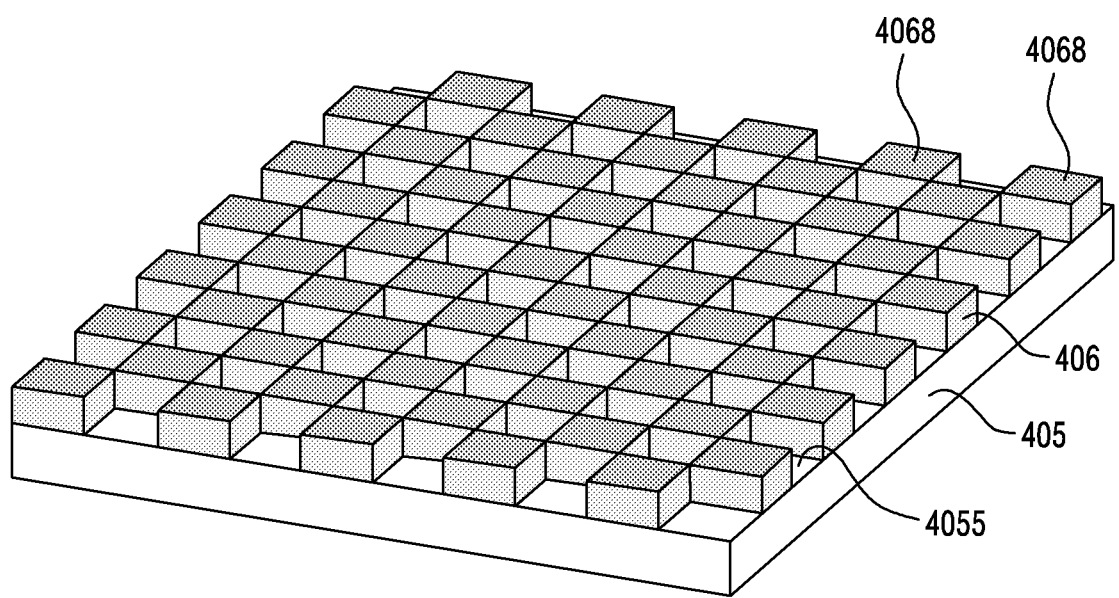
FIG. 8G is perspective views illustrating configurations of adhesive improvement layers according to various embodiments of the disclosure.
Figure 8H:
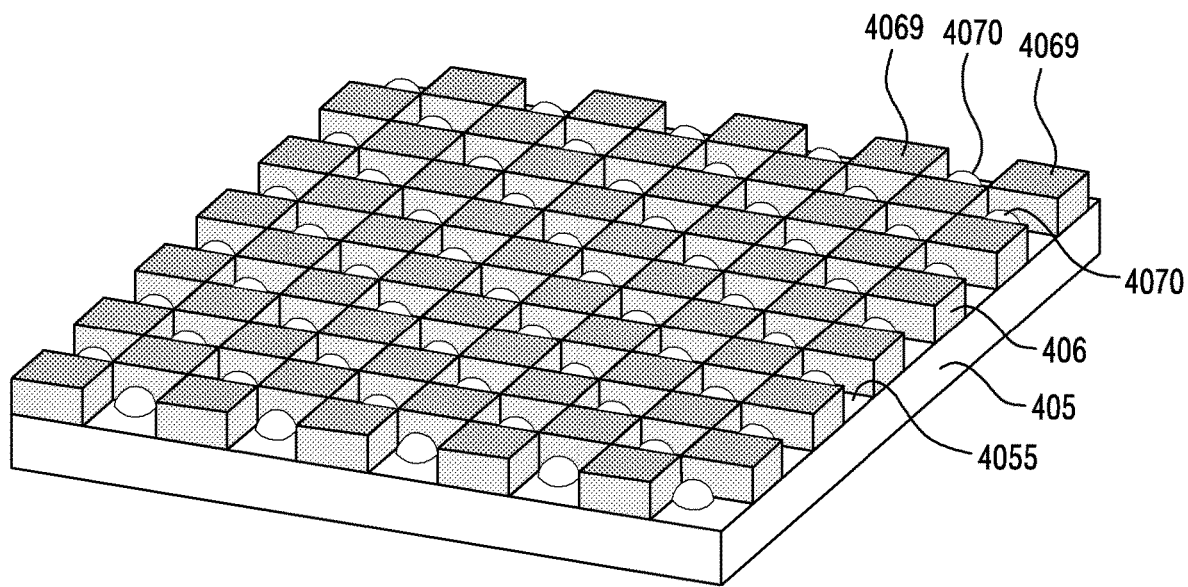
FIG. 8H is perspective views illustrating configurations of adhesive improvement layers according to various embodiments of the disclosure.

Referring to FIG. 8H, the adhesive improvement layer 406 disposed on the second surface 4055 of the opaque layer 405 may include a plurality of repeated first patterns 4069 having a rectangular dot shape and a plurality of repeated second patterns 4070 having a semispherical dot shape. According to an embodiment, the first patterns 4069 may be disposed on the second surface 4055 of the opaque layer 405 at a predetermined interval, and the second patterns 4070 may be disposed alternately with the rectangular shaped first patterns 4069. According to an embodiment, the rectangular first patterns 4069 and the semispherical second patterns 4070 may have the same height or different heights from the second surface 4055.

According to various embodiments, the attachment force or the bonding force of the attachment improvement layer with the waterproof layer may be quantitatively designed in consideration of at least one of the shapes, the number, and the intervals of the repeated patterns. For example, as illustrated in Table 1 below, for the same area of 15 mm×200 mm, when the diameter of the patterns of the four-color printing layer of the adhesive improvement layer (e.g., the adhesive improvement layer 406 of FIG. 8E) is set to 200 μm and the interval of the patterns of the plurality of repeated patterns (e.g., the plurality of repeated patterns 4066 of FIG. 8E) is set to 300 μm, an average tensile force of 11.021 N may be realized, which is similar to the tensile force of 11.467 N realized in an attachment layer (e.g., a general flat printing layer), to which the adhesive improvement layer is not applied. Moreover, for the same area, it can be seen that when the diameter of the patterns (e.g., the plurality of repeated patterns 4066 of FIG. 8E) of the four-color printing layer of the adhesive improvement layer is set to 1 mm and the interval of the patterns is set to 1.5 mm, an average tensile force of 8.45 M may be realized, whereby the tensile force (e.g., a release force) of the printing film (e.g., the printing film 400 of FIG. 5B) may be set quantitatively according to the intervals and the number of the plurality of repeated patterns (e.g., the plurality of repeated patterns 4066 of FIG. 8E) included in the adhesive improvement layer 406. This means that a tensile force (e.g., a release force) can be set such that an excellent delamination property is realized while a sufficient attachment force or bonding force is secured when the waterproof layer (e.g., the waterproof layer 321 of FIG. 5B) is required to be delaminated from the printing film for maintenance and repair of the electronic device.

TABLE 1

Comparison result of Dissimilar force of Printing Structure

| | Attachment layer | Adhesive improvement layer having repeated patterns | |
|---|---|---|---|
| | | Four-color printing layer/repeated dot pattern (case 1), diameter of 200 μm, interval of 300 μm | Four-color printing layer/repeated dot pattern (case 2), diameter of 1 mm, interval of 1.5 mm |
| Maximum value | 13.67N | 13.74N | 9.11N |
| Minimum value | 9.88N | 9.88N | 7.92N |
| Average | 11.467N | 11.021N | 8.45N |

Referring to FIG. 8G, the adhesive improvement layer 406 disposed on the second surface 4055 of the opaque layer 405 may include a plurality of repeated patterns 4068 having a rectangular dot shape. According to an embodiment, the plurality of repeated patterns 4068 may be disposed on the second surface 4055 of the opaque layer 405 to be regularly spaced apart from each other.

According to various embodiments, an electronic device (e.g., the electronic device 300 of FIG. 4) may include: an outer housing including a front plate (e.g., the front plate 320 of FIG. 4) facing a first direction, a rear plate (e.g., the rear plate 380 of FIG. 4) facing an opposite direction to the front plate, and a side member (e.g., the side member 312 of FIG. 4) surrounding a space (e.g., the space 3105 of FIG. 4) between the front plate and the rear plate, wherein the side member includes a protrusion (e.g., the protrusion 3121 of FIG. 4) protruding toward the space and including a first surface (e.g., the first surface 3101 of FIG. 4) facing the first direction; an opaque layer (e.g., the opaque layer 405 of FIG. 5B) disposed in the space to be parallel to the front plate and including a first portion (e.g., the first portion P1 of FIG. 4) located between the first surface and the front plate, wherein the first portion includes a second surface (e.g., the second surface 4055 of FIG. 5B) facing the first surface; an adhesive improvement layer (e.g., the adhesive improvement layer 406 of FIG. 5B) formed on the second surface of the opaque layer and having repeated patterns (e.g., the repeated patterns 4061 of FIG. 5B); and a waterproof layer (e.g., the waterproof layer 321 of FIG. 5B) disposed between the adhesive improvement layer and the first surface and attached to the adhesive improvement layer and the first surface.

According to various embodiments, the opaque layer (e.g., the opaque layer 405 of FIG. 5B) may include a pigment or a dye.

According to various embodiments, the adhesive improvement layer (e.g., the adhesive improvement layer 406 of FIG. 5B) may include an acrylic resin and silicon beads dispersed in an acrylic resin.

According to various embodiments, the waterproof layer (e.g., the waterproof layer 321 of FIG. 5B) may include polyethylene terephthalate (PET) and polyurethane.

According to various embodiments, a first bonding layer (e.g., the first bonding layer 3211 of FIG. 5B) may be disposed between the waterproof layer and the first surface, and a second bonding layer (e.g., the second bonding layer 3212 of FIG. 5B) may be disposed between the waterproof layer and the adhesive improvement layer.

According to various embodiments, the repeated patterns and at least portions of the second surface may be attached to the waterproof layer via the second bonding layer.

According to various embodiments, the front plate or the rear plate may include glass, sapphire, acryl, or reinforced plastic.

According to various embodiments, the electronic device may further include: at least one of an optical clear adhesive (OCA) layer (e.g., the OCA layer 3203 of FIG. 5B), a substrate film layer (e.g., the substrate film 401 of FIG. 5B), a color coating layer (e.g., the color coating layer 402 of FIG. 5B), a molding layer (e.g., the molding layer 403 of FIG. 5B), or at least one deposition layer (e.g., the deposition layer 404 of FIG. 5B), between the front plate (e.g., the front plate 320 of FIG. 5B) and the opaque layer (e.g., the opaque layer 405 of FIG. 5B).

According to various embodiments, the at least one deposition layer may include at least one of a Sn-based material, a Ti-based material, a Cr-based material, or an Al-based material.

According to various embodiments, the front plate (e.g., the front plate 320 of FIG. 4) may include a flat portion (e.g., the flat portion 3201 of FIG. 4) and a curved portion (e.g., the curved portion 3202 of FIG. 4) extending from the flat portion, and when the front plate is viewed from the top, the adhesive improvement layer may be disposed at a location that overlaps the curved surface.

According to various embodiments, the repeated patterns may be disposed on the second surface to have different or identical shapes, the same or different protrusion degrees, or uniform or different intervals.

According to various embodiments, an electronic device may include: an outer housing including a front plate facing a first direction, a rear plate facing an opposite direction to the front plate, and a side member surrounding a space between the front plate and the rear plate, wherein the side member includes a protrusion protruding toward the space and including a first surface facing the first direction; an opaque layer disposed in the space to be parallel to the front plate and including a first portion located between the first surface and the front plate, wherein the first portion includes a second surface facing the first surface and including repeated patterns; and a waterproof layer disposed between the second surface and the first surface and attached to the second surface and the first surface.

According to various embodiments, the repeated patterns may be formed of the same material as the opaque layer.

According to various embodiments, a first bonding layer may be disposed between the waterproof layer and the first surface, and a second bonding layer may be disposed between the waterproof layer and the second surface.

According to various embodiments, the opaque layer may include an acrylic resin and silicon beads dispersed in an acrylic resin.

According to various embodiments, the repeated patterns may have different or identical shapes, the same or different protrusion degrees, or uniform or different intervals.

According to various embodiments, a method for manufacturing an electronic device may include: attaching a substrate film to at least a partial area of a front plate; forming an opaque layer on the substrate film; forming an adhesive improvement layer having repeated patterns, on the opaque layer; attaching a waterproof layer to the adhesive improvement layer; and attaching the front plate to an outer housing via the waterproof layer.

According to various embodiments, at least one of a color coating layer, a molding layer, or at least one deposition layer may be further disposed between the opaque layer and the substrate film.

According to various embodiments, the opaque layer and/or the adhesive improvement layer may include an acrylic resin and silicon beads dispersed in the acrylic resin.

According to various embodiments, the repeated patterns may be disposed on the second surface to have different or identical shapes, the same or different protrusion degrees, or uniform or different intervals.

The embodiments of the disclosure disclosed in the specification and the drawings simply suggest specific examples to easily describe the technical contents according to the embodiments of the disclosure and help understanding of the embodiments of the disclose, and are not intended to limit the scopes of the embodiments of the disclosure. Accordingly, it should be construed that the scopes of the various embodiments of the disclosure include all changes or modifications deduced based on the technical spirits of the various embodiments of the disclosure, in addition to the embodiments disclosed herein.

The invention claimed is:

1. An electronic device comprising:
an outer housing comprising a front plate facing a first direction, a rear plate facing an opposite direction to the front plate, and a side member surrounding a space between the front plate and the rear plate, wherein the side member comprises a protrusion protruding toward the space and comprising a first surface facing the first direction;
an opaque layer disposed in the space to be parallel to the front plate and comprising a first portion located between the first surface and the front plate, wherein the first portion comprises a second surface facing the first surface;

an adhesive improvement layer formed on the second surface of the opaque layer and having repeated patterns; and a waterproof layer disposed between the adhesive improvement layer and the first surface and attached to the adhesive improvement layer and the first surface.

2. The electronic device of claim 1, wherein the opaque layer comprises a pigment or a dye.

3. The electronic device of claim 1, wherein the adhesive improvement layer comprises an acrylic resin and silicon beads dispersed in an acrylic resin.

4. The electronic device of claim 1, wherein the waterproof layer comprises polyethylene terephthalate (PET) and polyurethane.

5. The electronic device of claim 4, wherein a first bonding layer is disposed between the waterproof layer and the first surface, and a second bonding layer is disposed between the waterproof layer and the adhesive improvement layer.

6. The electronic device of claim 5, wherein the repeated patterns and at least portions of the second surface are attached to the waterproof layer via the second bonding layer.

7. The electronic device of claim 1, wherein the front plate or the rear plate comprises glass, sapphire, acryl, or reinforced plastic.

8. The electronic device of claim 1, further comprising:

at least one of an optical clear adhesive (OCA) layer, a substrate film layer, a color coating layer, a molding layer, or at least one deposition layer, between the front plate and the opaque layer.

9. The electronic device of claim 8, wherein the at least one deposition layer comprises at least one of a Sn-based material, a Ti-based material, a Cr-based material, or an Al-based material.

10. The electronic device of claim 1, wherein the front plate comprises a flat portion and a curved portion extending from the flat portion, and when the front plate is viewed from the top, the adhesive improvement layer is disposed at a location that overlaps the curved surface.

11. The electronic device of claim 1, wherein the repeated patterns are disposed on the second surface to have different or identical shapes, the same or different protrusion degrees, or uniform or different intervals.

12. A method for manufacturing an electronic device, the method comprising:

attaching a substrate film to at least a partial area of a front plate;

forming an opaque layer on the substrate film;

forming an adhesive improvement layer having repeated patterns, on the opaque layer;

attaching a waterproof layer to the adhesive improvement layer; and attaching the front plate to an outer housing via the waterproof layer.

13. The method of claim 12, wherein at least one of a color coating layer, a molding layer, or at least one deposition layer is further disposed between the opaque layer and the substrate film.

14. The method of claim 12, wherein the opaque layer or the adhesive improvement layer comprises an acrylic resin and silicon beads dispersed in the acrylic resin.

15. The method of claim 12, wherein the repeated patterns have different or identical shapes, the same or different protrusion degrees, or uniform or different intervals.

* * * * *